United States Patent
Frank et al.

(10) Patent No.: US 8,420,474 B1
(45) Date of Patent: Apr. 16, 2013

(54) CONTROLLING THRESHOLD VOLTAGE IN CARBON BASED FIELD EFFECT TRANSISTORS

(75) Inventors: Martin M. Frank, Dobbs Ferry, NY (US); Dechao Guo, Fishkill, NY (US); Shu-Jen Hen, Cortlandt, NY (US); Kuen-Ting Shiu, White Plains, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/348,355

(22) Filed: Jan. 11, 2012

(51) Int. Cl.
*H01L 21/8238* (2006.01)

(52) U.S. Cl.
USPC .......................... 438/199; 438/155; 438/200

(58) Field of Classification Search .................. 438/155, 438/154, 199, 200
See application file for complete search history.

(56) References Cited

U.S. PATENT DOCUMENTS

| | | | |
|---|---|---|---|
| 6,821,911 B1 * | 11/2004 | Lo et al. ........................ | 438/780 |
| 7,105,889 B2 | 9/2006 | Bojarczuk, Jr. et al. | |
| 7,170,120 B2 | 1/2007 | Datta et al. | |
| 7,482,232 B2 | 1/2009 | Appenzeller et al. | |
| 7,582,534 B2 * | 9/2009 | Afzali-Ardakani et al. .. | 438/287 |
| 7,858,454 B2 * | 12/2010 | Kalburge ...................... | 438/151 |
| 7,998,828 B2 * | 8/2011 | Chen et al. .................... | 438/407 |
| 2006/0063318 A1 | 3/2006 | Datta et al. | |
| 2010/0276753 A1 | 11/2010 | Greene et al. | |

OTHER PUBLICATIONS

Chen et al. (2006) An integrated logic circuit assembled on a single carbon nanotube. Science 311:1735-1735.
M. M. Frank et al., "Poly-Si/High-k Gate Stacks with Near-Ideal Threshold Voltage and Mobility," IEEE VLSI-TSA International Symposium on VLSI Technology, VLSI-TSA-Tech, Apr. 25-27, 2005, pp. 97-98.
S. J. Han et al., "Wafer Scale Fabrication of Carbon Nanotube FETs with Embedded Poly-gates," 2010 IEEE International Electron Devices Meeting (IEDM), Dec. 6-8, 2010, pp. 9.1.1-9.1.4.
K. Kita et al., "Origin of electric dipoles formed at high-k/SiO2 interface ," Appl. Phys. Lett., vol. 94, 2009, 132902, 3 pages.
H.-J. Li et al., "Dual high-? gate dielectric with poly gate electrode: HfSiON on nMOS and Al2O3 capping layer on pMOS," IEEE Electron Device Letters, vol. 26, Issue 7, Jul. 2005, pp. 441-444.
V. Narayanan et al., "Band-Edge High-Performance High-k/Metal Gate n-MOSFETs Using Cap Layers Containing Group IIA and IIIB Elements with Gate-First Processing for 45 nm and Beyond," Digest of Technical Papers. 2006 Symposium on VLSI Technology, pp. 178-179.

* cited by examiner

*Primary Examiner* — Kevin M Picardat
(74) *Attorney, Agent, or Firm* — Cantor Colburn LLP; Vazken Alexanian

(57) ABSTRACT

A field effect transistor fabrication method includes defining a gate structure on a substrate, depositing a dielectric layer on the gate structure, depositing a first metal layer on the dielectric layer, removing a portion of the first metal layer, depositing a second metal layer, annealing the first and second metal layers, and defining a carbon based device on the dielectric layer and the gate structure.

23 Claims, 9 Drawing Sheets

US 8,420,474 B1

CONTROLLING THRESHOLD VOLTAGE IN CARBON BASED FIELD EFFECT TRANSISTORS

BACKGROUND

The present invention relates to field effect transistor fabrication, and more specifically, to threshold voltage control of carbon-based field effect transistors.

Threshold voltage, Vt, control of carbon based field effect transistor devices (FET) such as carbon nanotube (CNT) FET devices relies on gate work function. Simple metal gates on the CNT FET devices may not generate the work functions needed to adjust the threshold voltage, partially because the CNT lattice will be destroyed using the conventional ion-implantation method with dopants to control the threshold voltage. As such, there are currently CMOS process flow limitations in controlling threshold voltage during the fabrication of the devices.

SUMMARY

Exemplary embodiments include a field effect transistor fabrication method, including defining a gate structure on a substrate, depositing a dielectric layer on the gate structure, depositing a first metal layer on the dielectric layer, removing a portion of the first metal layer, depositing a second metal layer, annealing the first and second metal layers, and defining a carbon based device on the dielectric layer and the gate structure.

Additional exemplary embodiments include a field effect transistor fabrication method, including defining a gate structure layer on a substrate, implanting dopants into the gate structure layer, depositing a gate metal layer on the gate structure layer, depositing a dielectric layer on the gate metal layer, depositing a first metal layer on the dielectric layer, removing a portion of the first metal layer, and depositing a second metal layer.

Additional exemplary embodiments include a field effect transistor fabrication method, including defining a gate structure layer on a substrate, implanting dopants into the gate structure layer, depositing a gate metal layer on the gate structure layer, depositing a dielectric layer on the gate metal layer, depositing a first metal layer on the dielectric layer, removing a portion of the first metal layer, depositing a second metal layer, removing a portion of the second metal layer, depositing a metal and silicon layer onto the first and second metal layers, annealing the metal and silicon layer, and the first and second metal layers and removing the metal and silicon layer, and the first and second metal layers.

Additional exemplary embodiments include a field effect transistor fabrication method, including defining a gate structure layer on a substrate, the gate structure layer having an n-type field effect transistor gate and a p-type field effect transistor gate, implanting an n-type dopant into the n-type field effect transistor gate, implanting a p-type dopant into the p-type field effect transistor gate, depositing a dielectric layer on the gate structure layer, depositing a first metal layer on the dielectric layer, removing a portion of the first metal layer, depositing a second metal layer, depositing a metal and silicon layer onto the second metal layer, annealing the metal and silicon layer, and the first and second metal layers and removing the metal and silicon layer, and the first and second metal layers.

Further exemplary embodiments include a field effect transistor device, including a substrate, a gate structure layer disposed on the substrate, gates disposed in the gate structure layer, a dielectric layer disposed on the gate structure layer and a carbon-based device disposed on the gate metal layer, wherein the dielectric layer is annealed with an element for n-type field effect transistor and p-type field effect transistor voltage control of the gates.

Additional features and advantages are realized through the techniques of the present invention. Other embodiments and aspects of the invention are described in detail herein and are considered a part of the claimed invention. For a better understanding of the invention with the advantages and the features, refer to the description and to the drawings.

BRIEF DESCRIPTION OF THE SEVERAL VIEWS OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

DETAILED DESCRIPTION

Exemplary embodiments include carbon based field effect transistors (FET) and methods to fabricate the carbon based FETs. The exemplary fabrication methods described herein control the threshold voltage Vt of the fabricated FETs. For illustrative purposes, carbon nanotube (CNT) FETs are described. However, it is to be appreciated that any carbon based transistor is contemplated. The exemplary CNT FETs described herein include embedded gate structures and dipole layers that include aluminum (Al) for the p-doped FETs (PFET), and dipole layers with lanthanum (La) (or other lanthanoid elements, magnesium (Mg), strontium (Sr), barium (Ba), scandium (Sc), or yttrium (Y) dysprosium (Dy), holmium (Ho), erbium (Er)) in elemental form, as oxide, or embedded in titanium nitride (TiN), for the n-doped FETs (NFET) to control the device Vt. The same methods can be applied for top-gated CNT FETs. Several resulting devices and several fabrication options are contemplated. The examples described herein are illustrative of the exemplary systems and methods. It will be appreciated that other resulting devices and fabrication methods are contemplated.

Figure 1:
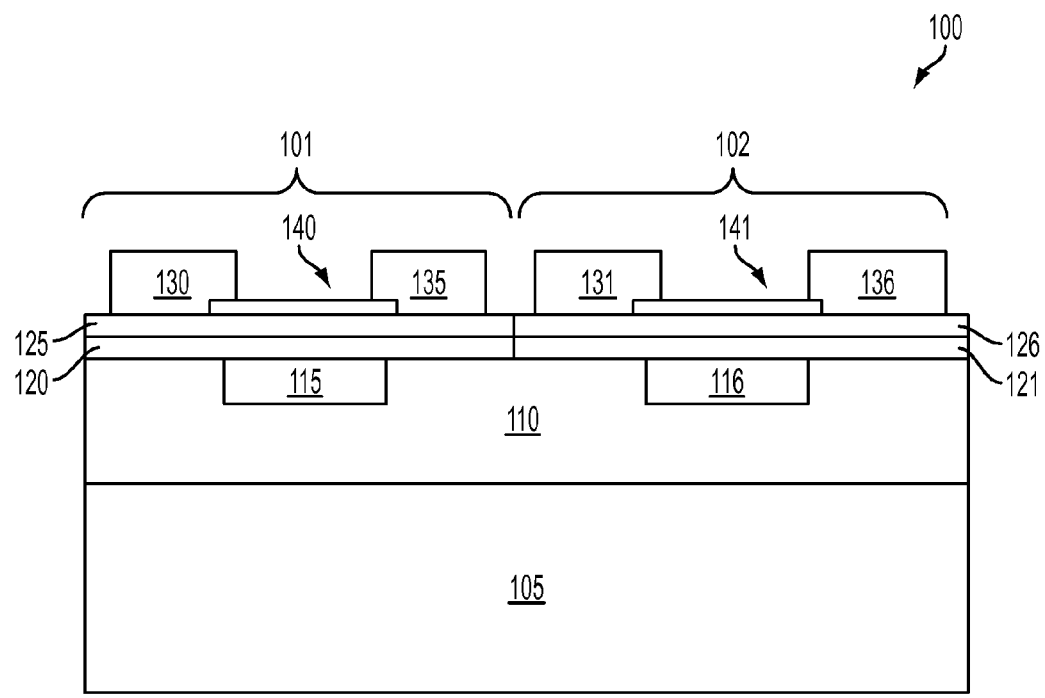
FIG. 1 illustrates an exemplary carbon based FET device in accordance with exemplary embodiments.

FIG. 1 illustrates an exemplary carbon based FET device 100 in accordance with exemplary embodiments. The device includes an NFET 101 and a PFET 102. The device 100 further includes a substrate 105 (e.g., silicon) and a gate layer 110 (e.g., silicon dioxide ($SiO_2$) or silicon nitride ($Si_3N_4$)). The gate layer 110 is an insulating layer into which gates 115, 116 are patterned and formed as described further herein. In the example device 100 of FIG. 1, the gates 115, 116 are initially doped with the same dopant as further described herein. The device 100 further includes metal gate layers 120, 121 disposed on the gate layer 110 and the gates 115, 116. The metal gate layers 120, 121 are shown as different metal types in the example. However, in other exemplary embodiments, the metal gate layers 120, 121 can be the same metal type. The device 100 also includes dielectric layers 125, 126 disposed respectively on the metal gate layers 120, 121. As described further herein, the dielectric layers 125, 126 are annealed with an element to respectively form the NFET and PFET Vt control. Each of the NFET 101 and PFET 102 respectively includes a source 130, 131 and a drain 135, 136. Each of the NFET 101 and PFET 102 also respectively includes carbon nanostructures 140, 141 (e.g., CNTs).

Figure 2:
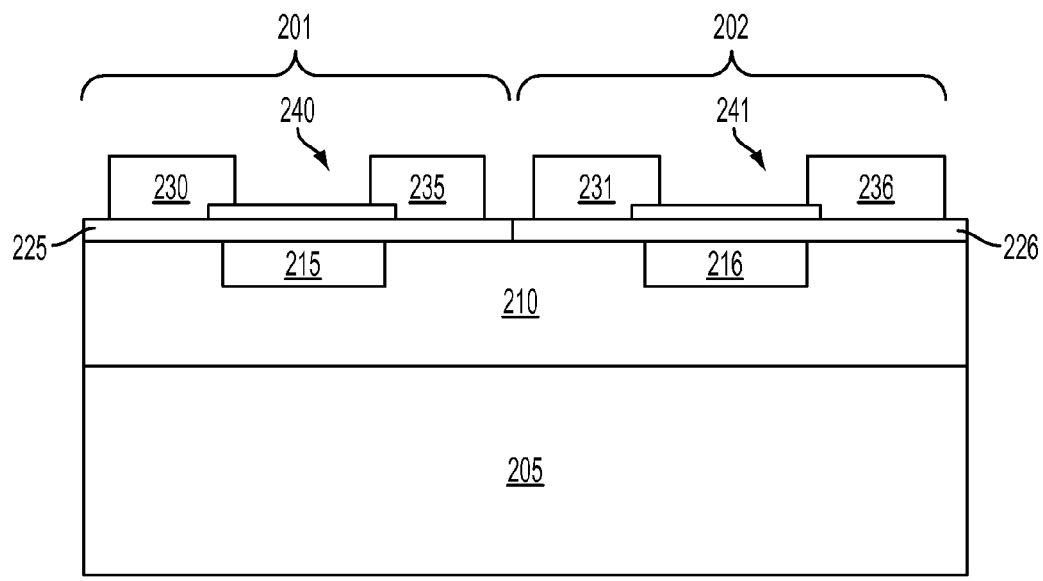
FIG. 2 illustrates an exemplary carbon based FET device in accordance with exemplary embodiments.

FIG. 2 illustrates an exemplary carbon based FET device 200 in accordance with exemplary embodiments. The device includes an NFET 201 and a PFET 202. The device 200 further includes a substrate 205 (e.g., silicon) and a gate layer 210 (e.g., silicon dioxide ($SiO_2$) or silicon nitride ($Si_3N_4$)). The gate layer 210 is the layer into which gates 215, 216 are patterned and formed as described further herein. In the example device 200 of FIG. 1, the gates 215, 216 are initially doped with the different dopants as further described herein, in contrast to the example of FIG. 1. For example, the gate 215 is doped with an N-type dopant, and the gate 216 is doped with a P-type dopant. The device 200 does not include metal gate layers in contrast to the example of FIG. 1. The device 200 also includes dielectric layers 225, 226 disposed on the gate layer 210 and the gates 215, 216. As described further herein, the dielectric layers 225, 226 are annealed with an element to respectively form the NFET and PFET Vt control. Each of the NFET 201 and PFET 202 respectively includes a source 230, 231 and a drain 235, 236. Each of the NFET 201 and PFET 202 also respectively includes carbon nanostructures 240, 241 (e.g., CNTs).

Figure 3:
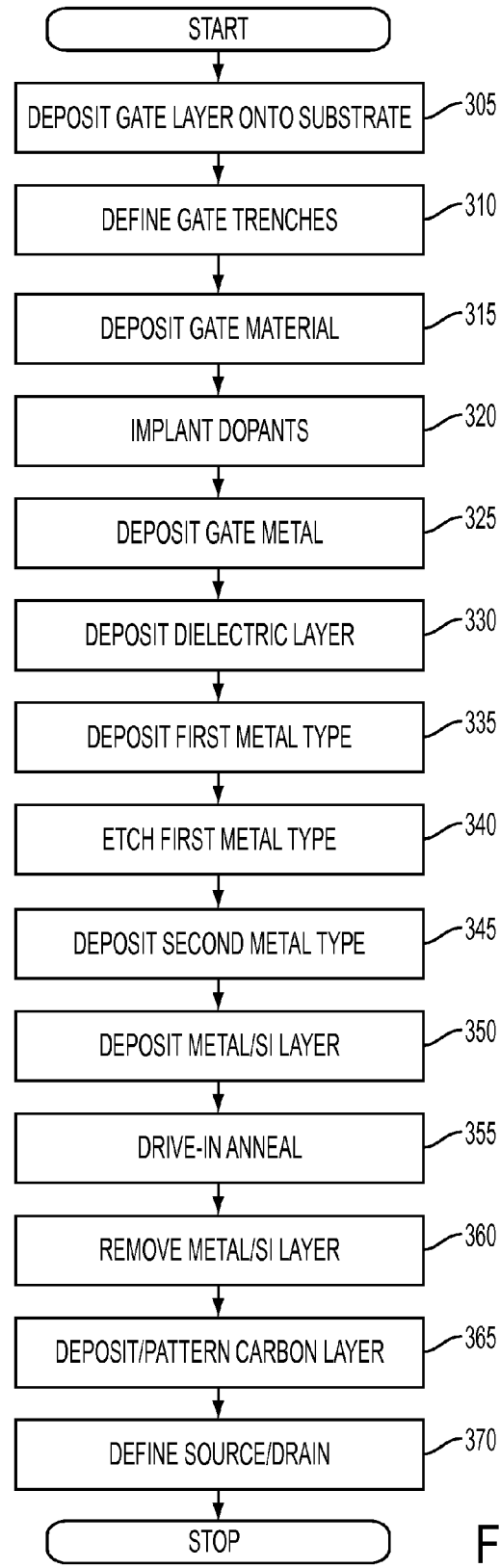
FIG. 3 illustrates a flow chart of a method for fabricating carbon-based FETs in accordance with exemplary embodiments.
Figure 4:
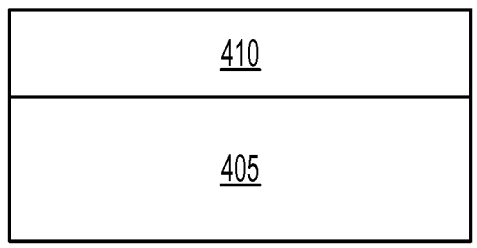
FIG. 4 illustrates the formation of a gate layer on a substrate.
Figure 5:
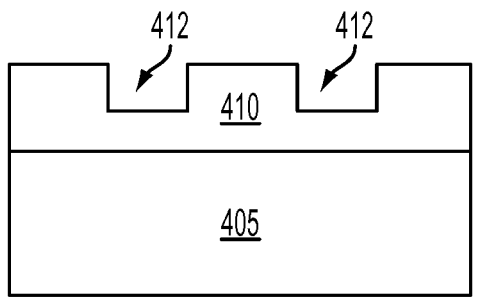
FIG. 5 illustrates the formation of trenches in the gate layer of FIG. 4.
Figure 6:
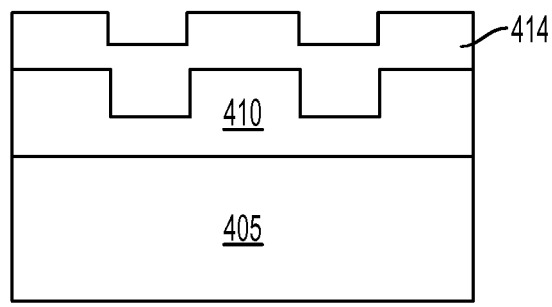
FIG. 6 illustrates the formation of a gate polysilicon material in the trenches of FIG. 5.
Figure 7:
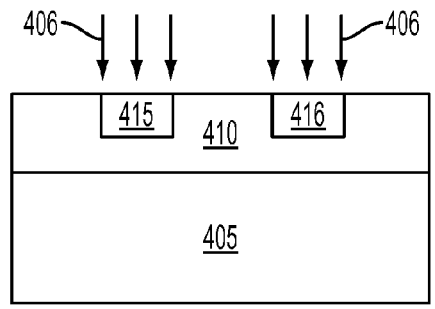
FIG. 7 illustrates an implantation of dopants into the gates.

FIG. 3 illustrates a flow chart of a method 300 for fabricating carbon-based FETs in accordance with exemplary embodiments. FIGS. 4-21 illustrate intermediate structures in accordance with the method 300. It will be appreciated that the method 300 can be modified in various manners to result in various structures such as the devices of FIGS. 1 and 2, as described further herein. At block 305, a gate layer 410 is deposited onto a substrate 405 as illustrated in FIG. 4. The gate layer 410 can be any suitable insulating material including, but not limited to, $SiO_2$ and $Si_3N_4$. In exemplary embodiments, the gate layer 410 can be deposited with any suitable deposition method including, but not limited to, chemical vapor deposition (CVD), wet oxidation and dry oxidation. At block 310, trenches 412 into which the gates are to be formed, are defined as illustrated in FIG. 5. In exemplary embodiments, any suitable photolithography and masking methods are implemented to define the trenches 412. In addition, any suitable etching techniques such as, but not limited to, wet chemical etching and reactive ion etching (RIE) are implemented to etch the gate layer 410. At block 315, a gate material layer 414 is formed within the trenches as illustrated in FIG. 6. In exemplary embodiments, any suitable material such as, but not limited to, polysilicon and any suitable deposition technique is used to form the gate material layer 414. The gate material layer 414 is then planarized so as to be flush with the gate layer 410. In exemplary embodiments, the polysilicon is polished with any suitable technique including but not limited to chemical mechanical polishing (CMP) so as to define gates 415, 416, as shown in FIG. 7. At block 320, the gates 415, 416 are implanted with suitable dopants 406, which can be either of p-type or n-type in the method 300 as also shown in FIG. 7. At block 325, metal gates 420, 421 are deposited on the gate layer 410 and gates 415, 416.

Figure 8A:
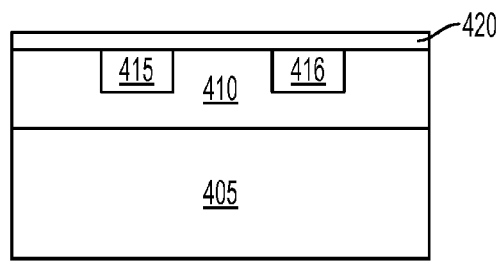
FIG. 8A illustrates one embodiment of a formation of a gate metal layer.
Figure 8B:
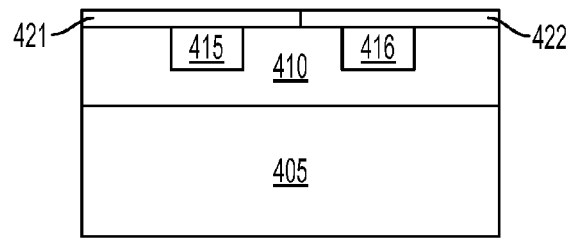
FIG. 8B illustrates another embodiment of a formation of a gate metal layer.
Figure 9:
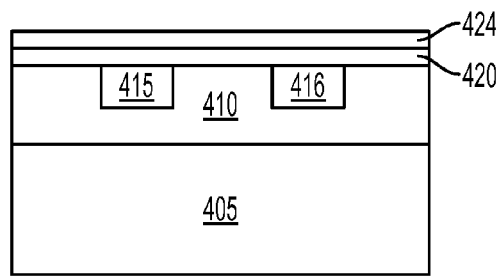
FIG. 9 illustrates a formation of a dielectric layer.

In exemplary embodiments, a single metal layer 420 such as, but not limited, to Al can be deposited as illustrated in FIG. 8A. In other exemplary embodiments, a first NFET metal layer 421 such as but not limited to La, Mg, Sr, Ba, Sc, Y, dysprosium (Dy), holmium (Ho), erbium (Er) in elemental form, as oxide, or embedded in titanium nitride (TiN), can be deposited over one of the gates 415, 416 and a second PFET metal layer 422 such as, but not limited to, Al followed by or embedded in TiN, can be deposited over the other of the gates 415, 416 as illustrated in FIG. 8B. For illustrative purposes, the method is shown and described with the single metal layer 420 as illustrated in FIG. 8A. It is understood that the method 300 could also proceed with the two metal layers 421, 422. As further described herein, for illustrative purposes, the gate 415 is described as the NFET side gate and the gate 416 is described as the PFET side gate. It will be appreciated that either or both gates 415, 416 can be NFET or PFET gates. At block 330, a dielectric layer 424 is deposited onto the metal layer 420 as illustrated in FIG. 9. In exemplary embodiments, the dielectric layer can be any suitable dielectric material, that is, any electrical insulators or in which an electric field can be sustained with a minimal dissipation of power. For example, the dielectric layer 424 can be $SiO_2$ and can be deposited with any suitable deposition technique as described herein.

Figure 10:
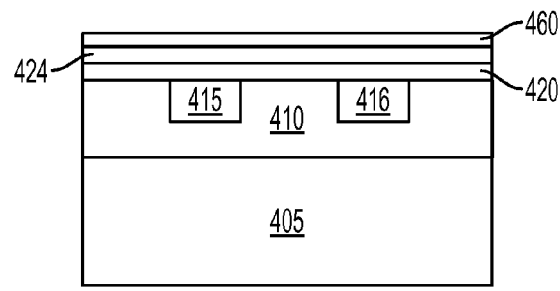
FIG. 10 illustrates a formation of a first metal layer.
Figure 11:
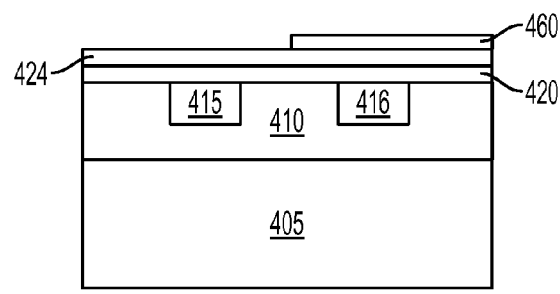
FIG. 11 illustrates a removal of a portion of the first metal layer of FIG. 10.
Figure 12:
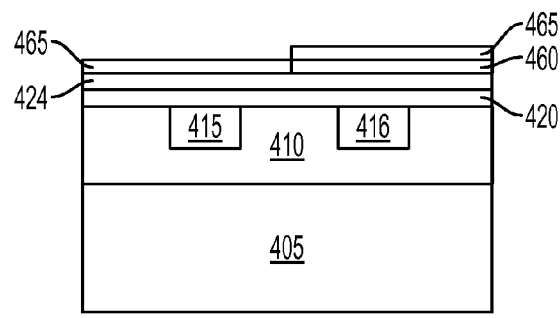
FIG. 12 illustrates a formation of a second metal layer.
Figure 13:
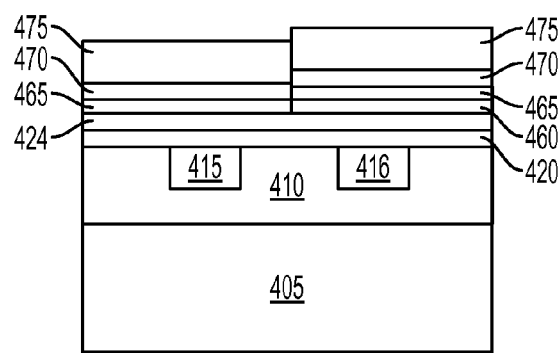
FIG. 13 illustrates a formation of an additional metal layer and a silicon layer.
Figure 14:
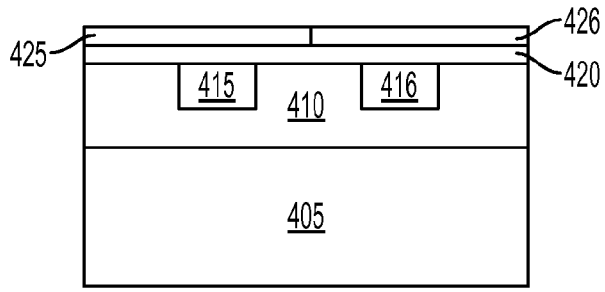
FIG. 14 illustrates a removal of the additional metal layer and the silicon layer of FIG. 13 after a drive-in anneal.
Figure 15:
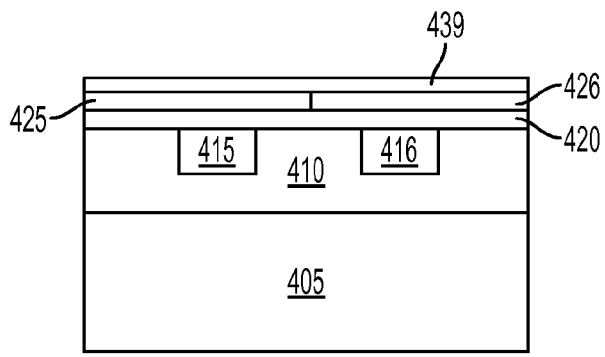
FIG. 15 illustrates a formation of a carbon layer.
Figure 16:
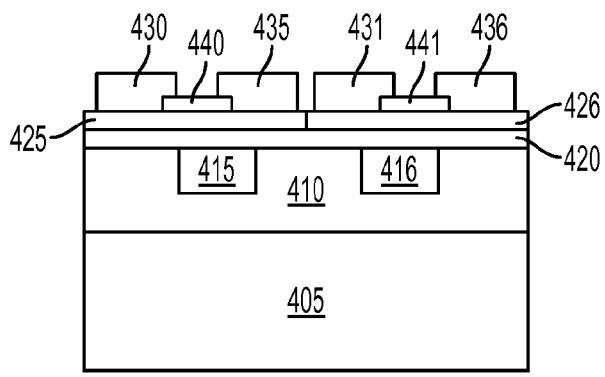
FIG. 16 illustrates a patterning of the carbon layer of FIG. 15 and a formation of sources and drains.

As described herein, the NFETs and PFETs can be defined by the types of metal layers subsequently deposited and the processing steps subsequently performed. At block 335, a first metal layer 460 of a first metal type is deposited on the dielectric layer 424 as illustrated in FIG. 10. As described herein, either of a NFET or PFET metal can be deposited and processed. For illustrative purposes the gate 415 is the NFET side gate and the gate 416 is the PFET side gate. In exemplary embodiments, the first metal type is a PFET metal, which can include but is not limited to Al followed by or embedded in TiN. At block 340, the first metal layer 460 is etched from the NFET side gate 415 as illustrated in FIG. 11. In exemplary embodiments, standard photolithography and etching techniques can be implemented to pattern and remove the first metal layer 460. At block 345, a second metal layer 465 of a second metal type is deposited on the first metal layer 460 that remained over the PFET side gate 416 and the dielectric layer 424 as illustrated in FIG. 12. The first and second metal layers 460, 465 are deposited with any suitable metal deposition techniques. In exemplary embodiments, the second metal type is an NFET metal, which can include but is not limited to La, Mg, Sr, Ba, Sc, Y, Dy, Ho, and Er in elemental form, as oxide, or embedded in TiN. At block 350, an additional layer of metal 470 and a silicon layer 475 are deposited sequentially over the second metal layer 465 as illustrated in FIG. 13. In exemplary embodiments, the additional layer of metal can be any suitable metal such as TiN that does not recrystallize or impart any of its properties during subsequent processing steps such as annealing. At block 355, a drive-in anneal is performed in order to drive the PFET metal from the first metal layer 460 into the dielectric layer 424 and the gate 416 and to drive the NFET metal from the second metal layer 465 into the dielectric layer 424 and the gate 415. At block 360, the additional layer of metal 470 and silicon layer 475 are removed. In exemplary embodiments, any suitable etching technique can be implemented to remove the additional layer of metal 470 and silicon layer 475. After the drive-in anneal, as illustrated in FIG. 14, the dielectric layer 424 becomes distinctively defined as an n-type layer 425 and a p-type layer 426. At block 365, a carbon layer 439 is deposited over the dielectric layers 425, 426 as illustrated in FIG. 15. The carbon layer 439 can be defined and patterned for the device types contemplated for the NFET/PFET structure such as a CNT FET as described herein, resulting in the NFET and PFET side carbon based devices 440, 441. It will be appreciated that any type of carbon based device is contemplated in other exemplary embodiments. At block 470, the remaining source 430, 431 and drain 435, 436 contacts are defined as described herein. It will be appreciated that any standard photolithography and etching techniques can be implemented to define and pattern the source 430, 431 and drain 435, 436 of the NFET and PFET devices. The resultant structure is similar to the device as illustrated in FIG. 1.

Figure 17:
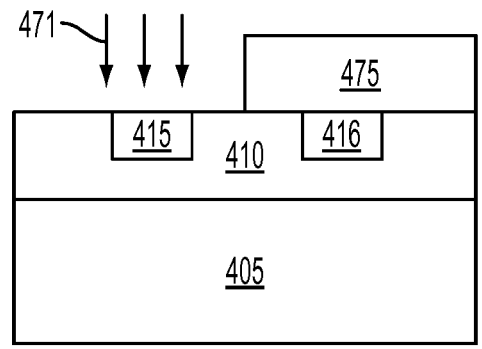
FIG. 17 illustrates an alternate implantation of dopants into the gates of FIG. 7.
Figure 18:
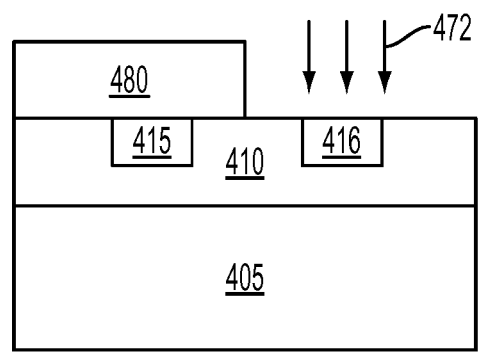
FIG. 18 illustrates another alternate implantation of dopants into the gates of FIG. 7.
Figure 19:
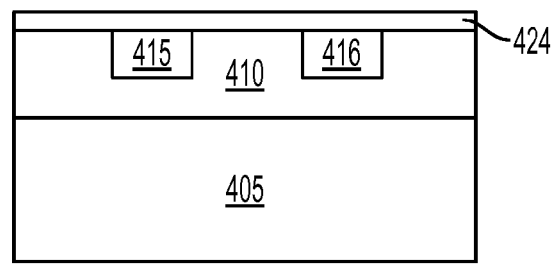
FIG. 19 illustrates a formation of a dielectric layer.

In exemplary embodiments, the method 300 can be modified such that the intermediate structures and final structures are modified, but still achieve the threshold voltage control in the resultant devices. For example, at block 320 described herein, the gates 415, 416 are implanted with the same dopant. In other exemplary embodiments, instead of implanting both gates 415, 416 with the same dopant, a first dopant 471 can be implanted on the NFET gate 415 with an n-type dopant, while the PFET gate 416 is covered with photoresist 475 as illustrated in FIG. 17. Similarly, a second dopant 472 can be implanted on the PFET gate 416 with a p-type dopant, while the NFET gate 416 is covered with photoresist 480 as illustrated in FIG. 18. As described herein, any suitable photolithography and masking technique can be implemented to protect the NFET gate 415 and the PFET gate 416 during the respective implants. In exemplary embodiments, the deposition of the gate metal layer 420 and block 325 can be skipped, and the dielectric layer 424 is deposited at block 330 as illustrated in FIG. 19. The subsequent fabrication blocks in method 300 are then performed as described with respect to FIG. 3. The resultant structure is similar to the device as illustrated in FIG. 2.

Figure 20:
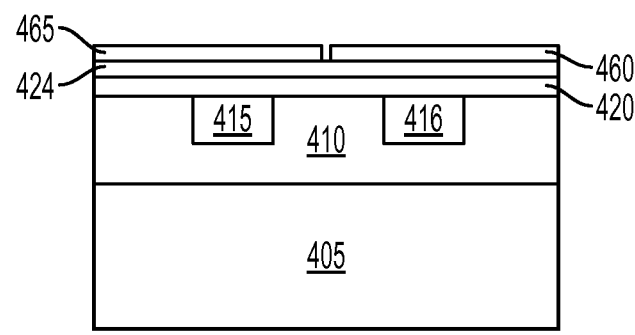
FIG. 20 illustrates a formation of a first metal layer and a second metal layer.
Figure 21:
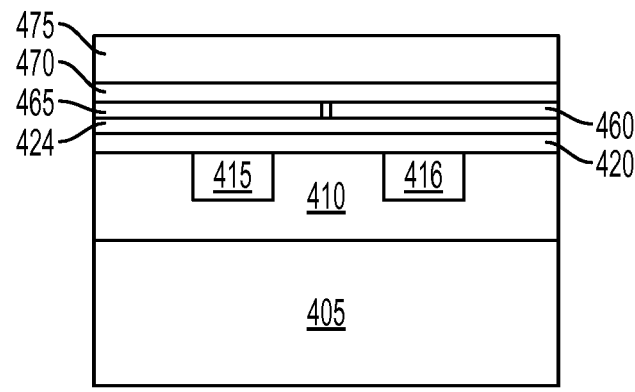
FIG. 21 illustrates a formation of an additional metal layer and a silicon layer.

In another example, referring again to FIG. 3, at block 345 a second metal type is deposited. In exemplary embodiments, instead of depositing the additional metal layer 470 and the silicon layer 475 at block 350, the second metal layer 465 is first etched from the first metal layer 460, as illustrated in FIG. 20. Then, as illustrated in block 350, the additional layer of metal 470 and a silicon layer 475 are deposited sequentially over the second metal layer 465 as illustrated in FIG. 21. The subsequent fabrication blocks in method 300 are then performed as described with respect to FIG. 3. The resultant structure is similar to the device as illustrated in FIG. 1.

Figure 22:
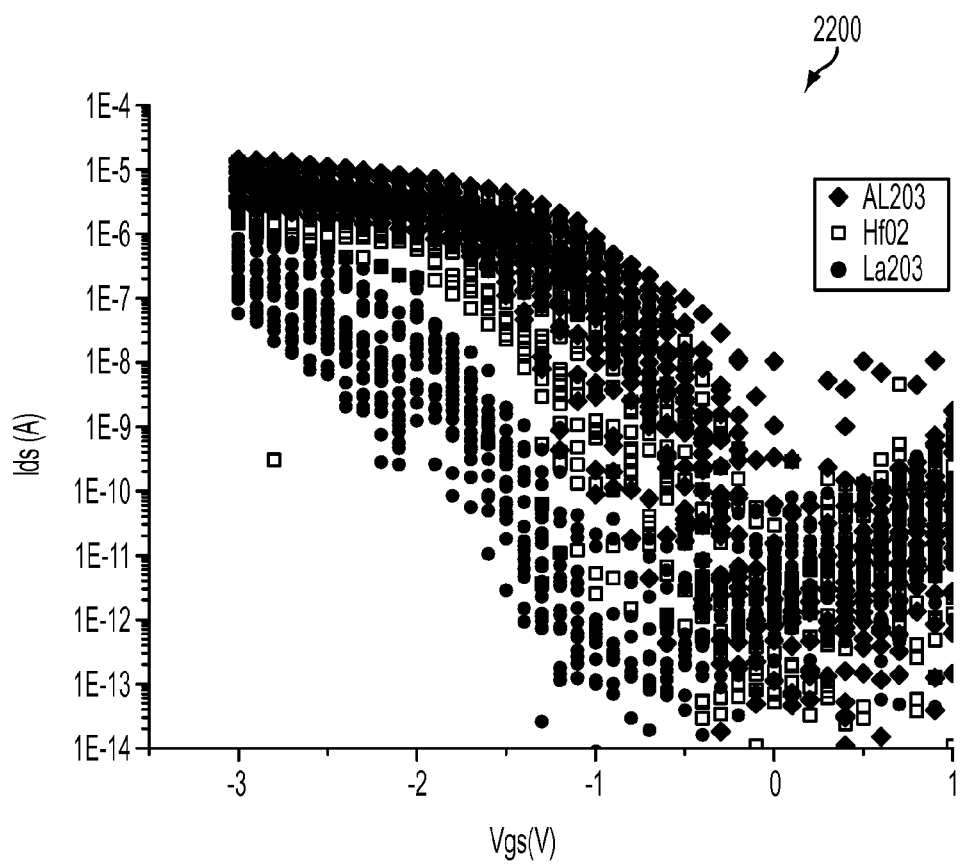
FIG. 22 illustrates a plot of device transfer curves showing the threshold voltage adjustment by employing different dipole layers.

FIG. 22 illustrates a plot of carbon nanotube device transfer curves showing the threshold voltage adjustment by employing different dipole layers. The plot 2200 illustrates that, for PFET, Al-based gate dielectric lowers the threshold voltage and La-based dielectric increases the threshold voltage as described herein. As such, the threshold voltage can be tuned during the gate stack fabrication process without having to dope the resultant devices, which can potentially be damaged during the conventional ion-implantation process.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated The flow diagrams depicted herein are just one example. There may be many variations to this diagram or the steps (or operations) described therein without departing from the spirit of the invention. For instance, the steps may be performed in a differing order or steps may be added, deleted or modified. All of these variations are considered a part of the claimed invention.

While the preferred embodiment to the invention had been described, it will be understood that those skilled in the art, both now and in the future, may make various improvements and enhancements which fall within the scope of the claims which follow. These claims should be construed to maintain the proper protection for the invention first described.

What is claimed is:

1. A field effect transistor (FET) fabrication method, comprising:
   defining a gate structure on a substrate;
   depositing a dielectric layer on the gate structure;
   depositing a first metal layer on the dielectric layer;
   removing a portion of the first metal layer;
   depositing a second metal layer;
   annealing the first and second metal layers; and
   defining a carbon based device on the dielectric layer and the gate structure.

2. The method as claimed in claim 1 further comprising defining a source and drain on the dielectric layer.

3. The method as claimed in claim 1 further comprising implanting a dopant into the gate structure prior to depositing the dielectric layer.

4. The method as claimed in claim 3 wherein the gate structure includes a n-type FET (NFET) gate and a p-type FET (PFET) gate.

5. The method as claimed in claim 4 wherein the NFET gate is implanted with an n-type dopant and the PFET gate is implanted with a p-type dopant.

6. The method as claimed in claim 4 wherein the NFET gate and the PFET gate are implanted with at least one of an n-type dopant and a p-type dopant.

7. The method as claimed in claim 1 wherein the first metal layer is at least one of aluminum (Al), lanthanum (La), magnesium (Mg), strontium (Sr), barium (Ba), scandium (Sc), yttrium (Y), dysprosium (Dy), holmium (Ho), and erbium (Er) in elemental form, as oxide, and embedded in titanium nitride (TiN).

8. The method as claimed in claim 1 wherein the first metal layer is at least one of aluminum (Al), lanthanum (La), magnesium (Mg), strontium (Sr), barium (Ba), scandium (Sc), yttrium (Y), dysprosium (Dy), holmium (Ho), and erbium (Er) in elemental form, as oxide, and embedded in titanium nitride (TiN).

9. The method as claimed in claim 1 further comprising depositing a gate metal layer prior to depositing the dielectric layer.

10. The method as claimed in claim 1 further comprising:
depositing a metal and silicon layer onto the second metal layer prior to annealing the first and second metal layers; and
removing the metal and silicon layer.

11. The method as claimed in claim 10 further comprising removing the first and second metal layers.

12. A field effect transistor (FET) fabrication method, comprising:
defining a gate structure layer on a substrate;
implanting dopants into the gate structure layer;
depositing a gate metal layer on the gate structure layer;
depositing a dielectric layer on the gate metal layer;
depositing a first metal layer on the dielectric layer;
removing a portion of the first metal layer; and
depositing a second metal layer.

13. The method as claimed in claim 12 further comprising:
depositing a metal and silicon layer onto the second metal layer;
annealing the metal and silicon layer, and the first and second metal layers; and
removing the metal and silicon layer, and the first and second metal layers.

14. The method as claimed in claim 12 further comprising:
defining a carbon based device on the dielectric layer and the gate structure; and
defining a source and drain on the dielectric layer.

15. The method as claimed in claim 12 wherein the gate metal layer is at least one of aluminum (Al), lanthanum (La), magnesium (Mg), strontium (Sr), barium (Ba), scandium (Sc), yttrium (Y), dysprosium (Dy), holmium (Ho), and erbium (Er) in elemental form, as oxide, and embedded in titanium nitride (TiN).

16. A field effect transistor (FET) fabrication method, comprising:
defining a gate structure layer on a substrate;
implanting dopants into the gate structure layer;
depositing a gate metal layer on the gate structure layer;
depositing a dielectric layer on the gate metal layer;
depositing a first metal layer on the dielectric layer;
removing a portion of the first metal layer;
depositing a second metal layer;
removing a portion of the second metal layer;
depositing a metal and silicon layer onto the first and second metal layers;
annealing the metal and silicon layer, and the first and second metal layers; and
removing the metal and silicon layer, and the first and second metal layers.

17. The method as claimed in claim 16 further comprising defining a carbon based device on the dielectric layer and the gate structure.

18. The method as claimed in claim 17 further comprising defining a source and drain on the dielectric layer.

19. The method as claimed in claim 17 wherein the gate metal layer is at least one of aluminum (Al), lanthanum (La), magnesium (Mg), strontium (Sr), barium (Ba), scandium (Sc), yttrium (Y), dysprosium (Dy), holmium (Ho), and erbium (Er) in elemental form, as oxide, and embedded in titanium nitride (TiN).

20. A field effect transistor (FET) fabrication method, comprising:
defining a gate structure layer on a substrate, the gate structure layer having an n-type FET (NFET) gate and a p-type FET (PFET) gate;
implanting an n-type dopant into the NFET gate;
implanting a p-type dopant into the PFET gate;
depositing a dielectric layer on the gate structure layer;
depositing a first metal layer on the dielectric layer;
removing a portion of the first metal layer;
depositing a second metal layer;
depositing a metal and silicon layer onto the second metal layer;
annealing the metal and silicon layer, and the first and second metal layers; and
removing the metal and silicon layer, and the first and second metal layers.

21. The method as claimed in claim 20 further comprising defining a carbon based device on the dielectric layer and the gate structure.

22. The method as claimed in claim 21 further comprising defining a source and drain on the dielectric layer.

23. The method as claimed in claim 20 wherein the gate metal layer is at least one of aluminum (Al), lanthanum (La), magnesium (Mg), strontium (Sr), barium (Ba), scandium (Sc), yttrium (Y), dysprosium (Dy), holmium (Ho), and erbium (Er) in elemental form, as oxide, and embedded in titanium nitride (TiN).

* * * * *